United States Patent [19]
Kraiss et al.

[11] Patent Number: 5,223,037
[45] Date of Patent: Jun. 29, 1993

[54] PLANT FOR THE MANUFACTURE OF PRINTED-CIRCUIT BOARDS OR MULTI-LAYERS

[75] Inventors: Niko Kraiss, Sindelfingen; Rainer Haas, Herrenberg; Werner Renz, Pforzheim, all of Fed. Rep. of Germany

[73] Assignee: Hans Hollmuller Maschinenbau GmbH & Co, Herrenberg, Fed. Rep. of Germany

[21] Appl. No.: 601,392

[22] Filed: Oct. 23, 1990

[30] Foreign Application Priority Data

Oct. 27, 1989 [DE] Fed. Rep. of Germany ....... 3935831

[51] Int. Cl.$^5$ .............................................. B05C 3/02
[52] U.S. Cl. ................................... 118/411; 118/423; 118/600; 118/602; 118/73
[58] Field of Search ............... 118/400, 423, 426, 428, 118/429, 411, 600, 70, 73, 602

[56] References Cited

U.S. PATENT DOCUMENTS 3,752,381  8/1973  Watson, Jr. .................. 118/400
4,608,941  9/1986  Morris ......................... 118/404
4,839,056  6/1989  Cahn ............................ 210/643
4,964,365 10/1990  D'Amato ..................... 118/429

*Primary Examiner*—W. Gary Jones
*Assistant Examiner*—Brenda Lamb
*Attorney, Agent, or Firm*—Fred Philpitt

[57] ABSTRACT

A plant for the manufacture of feedthrough (through-hole plated) printed-circuit boards or multilayers which comprises four modules (1, 11, 16, 21) through which the objects (3) to be treated are passed in a horizontal continuous process. In the first module (1) the surfaces to be coated are conditioned in an alkaline aqueous solution. An oxidative pre-treatment of the surfaces to be coated takes place in the second module (11). In the third module (16) a coating of organic monomers is deposited on the surfaces to be coated. Finally, in the fourth module (21) the deposited monomers are polymerized to form an electrically conductive coating. The printed-circuit boards or multilayers (3) thus treated and made electrically conductive on the lateral surfaces of the drill-holes are then passed on for the metallization of the lateral surfaces of the drill-holes (FIG. 1).

7 Claims, 2 Drawing Sheets

PLANT FOR THE MANUFACTURE OF PRINTED-CIRCUIT BOARDS OR MULTI-LAYERS

DESCRIPTION

The invention concerns a plant for the manufacture of feedthrough (through-hole plated) printed-circuit boards or multilayers, in which the following chemical/physical processes are carried out to produce an electrically conductive coating on the lateral surfaces of drill-holes:

a) Conditioning of the surfaces to be coated in an alkaline aqueous solution of an organic solvent;

b) Oxidative pre-treatment of the surfaces to be coated in an oxidising treatment liquid, preferably in an alkaline permanganate solution;

c) Depositing of a coating of organic monomers on the surfaces to be coated from an aqueous solution of these monomers containing an organic solvent;

d) Polymerisation of the deposited monomers to form an electrically conductive coating in an acidic treatment liquid.

In recent times the pursuit of greater circuit densities is increasingly achieved by coating both sides of electronic printed-circuit boards with conductor patterns, which are then connected to one another via drill-holes whose lateral surfaces are made electrically conductive. In this case, we speak of "feedthrough" or "through-hole plated" printed-circuit boards. This concept is also extended to multilayer structures, i.e. where more than two conductor patterns arranged on opposite sides of an insulating substrate are connected to one another electrically via drill-holes. In this case, we speak of feedthrough multilayers. For the sake of linguistic simplicity, however, reference will henceforth be made solely to "printed-circuit boards", by which "multilayers" are intended to be understood implicitly.

In industrial practice, feedthrough printed-circuit boards have been manufactured hitherto almost exclusively by the process of "external-currentless copper-plating". After the cleaning and so-called conditioning of the substrate, this process includes treatment in a noble metal catalyst solution from which the printed-circuit boards are then transferred into the actual currentless copper bath. Such currentless copper baths contain complexing agents and usually formaldehyde. However, the use of noble metal catalysts as well as that of complexing agents and formaldehydes is not very desirable on environmental grounds. Moreover, the maintenance and the bath monitoring of the external-currentless copperplating process is costly and complicated. Even when the work is carried out carefully there is still the risk of one of the baths accidentally "failing".

It is for this reason that a plant of the kind mentioned at the outset has been developed. It is described in DE-PS 38 06 884. In this plant the first electrical conductivity on the lateral surfaces of the drill-holes is no longer acheived by means of metallisation or copperplating, but rather by means of an electrically conductive polymer film. This electrically conductive polymer film is then suitable for the subsequent metallisation with copper, for example in a galvanic bath. This process not only avoids the undesirable noble metal catalysts, formaldehyde and complexing agents; in addition, the implementation of the process is made much less problematic. Hitherto, however, the known process has largely only been carried out on a laboratory scale using the dipping method. It is not yet suitable, therefore, for mass production.

The task of the present invention is to design a plant of the kind mentioned at the outset in such a way that large unit numbers can be achieved in industrial production.

This task is solved according to the invention by the fact that e) for each process a to d there is a separate module provided through which the printed-circuit boards are passed in turn on a conveyor system in a horizontal continuous process,
whereby f) the path of motion of the printed-circuit boards inside the modules runs at least in part below the surface of the treatment liquid provided there.

Plants constructed in a modular fashion, through which printed-circuit boards are passed on a conveyor system in a horizontal continuous process, are known per se for other tasks in the industrial manufacture of printed-circuit boards. According to the invention, therefore, the process known from DE-PS 38 06 884 is firstly transformed into a continuous process. The fact that this is possible, however, is by no means obvious. It is necessary to take into account that the "growth" of the first monomer coating on the walls of the drill-holes is a dynamically very delicate process. It is reasonable to make the assumption that relative movements between the printed-circuit board and the treatment liquid must be avoided in this phase, i.e. that the printed circuit boards must in fact remain stationary during contact with the solution containing the monomers. With the invention, it has been shown for the first time that this assumption is not correct, i.e. that contrary to the misgivings a carefully performed relative movement of the printed-circuit boards against the treatment liquid is not only not detrimental to success, but is even conducive to it.

However, the knowledge gained from the stationary dipping method (DE-PS 38 06 884) can in no way by converted on a one-to-one basis to a continuous process. On the contrary, this convertion requires a large number of individual measures which must be painstakingly adherred to, without which success may be put into question. Finding out these individual measures represents a very difficult process, and the significance is not immediately recognisable in every case.

Thus, for example, according to one feature of the invention the achievement of satisfactory results is facilitated if a rinsing module, in which both sides of the printed-circuit boards are sprayed with rinsing water, is included between each of the successive modules in which processes a, b, c take place, whereby however the modules in which processes c and d take place are directly adjacent to one another with their respective output station and input station, without a rinsing module being inserted between them. The use of rinsing modules between successive treatment modules follows from the experience gained with continuous processes in other areas of production. It could not readily be anticipated, however, that a rinsing process is, on the contrary, harmful when included between the modules in which the surfaces to be coated are coated with monomers and the monomers are then polymerised out to form the electrically conductive coating.

The air space inside the modules in which processes a to d take place should be subjected to suction. It is extraordinarily important for the success achieved in the plant according to the invention that the chemical/physical processes are used on the printed-circuit boards in a precisely defined manner. In this regard, it can even be harmful if only droplets or splashes entrained by an air stream strike the printed-circuit board at an uncontrolled point in time. The suction applied to the different modules largely prevents this kind of flying droplet.

A flying droplet between the last two modules of the plant discussed here is particularly critical. As already mentioned above, there are preferably not separated from one another by a rinsing machine. It is preferable here, therefore, to make supply air available for feeding into the air space in the output station of the module in which process c takes place and into the air space in the input station of the module in which process d takes place. This supply air in the interconnected output and input stations, together with the low pressure in the modules subjected to suction, ensures that a stream of air can only travel from the output or input station back into the respective module, but never across from module to module. Droplets contained in the streams of air is thus unable to get from module to module. Preferably, the rinsing modules are designed as cascade rinsing machines with several separate chambers, through which rinsing water flows in the opposite direction to that of the printed-circuit boards. In such cascade rinsing machines known per se, the cleaning effect is particularly good with a low consumption of rinsing water.

Following the module in which process d takes place, a rinsing and pickling module should be inserted in which the printed-circuit boards are sprayed on both sides with dilute acid. The polymerisation, which takes place in the last module of the plant, leads to a voluminous blackish deposit which is easily removed from the metallic surfaces of the printed-circuit boards. This deposit must be removed and/or transported away, which preferably takes place in this rinsing and pickling module.

The use of different chemicals is minimised if the same treatment liquid is used in the module in which process d takes place and in the rinsing and pickling module. 5% sulphuric acid is particularly suitable for this.

With the same treatment liquid in the last module of the plant and in the rinsing and pickling module, it is recommendable for the treatment liquid of the module in which process d takes place to be taken from the rinsing and pickling module.

The reduction in the consumption of chemicals is also served by the measure whereby the treatment liquid in the module in which process b takes place can be recycled via an electrolysis cell in which the treatment liquid is regenerated. This treatment liquid is generally an alkaline permanganate solution. As is known, the permanganate is returned to a lower oxidation number in the oxidation process and can be oxidated back up again electolytically.

As already emphasised above, the printed-circuit boards should be passed through the various modules at least in some areas beneath the level of the treatment liquid provided there. For this purpose, it is recommended to have a design whereby the modules in which processes a to d take place each have a sump for the treatment liquid and a container arranged on the path of motion of the printed-circuit boards, a pump being provided in each case to pump the treatment liquid from the sump into the container in such a way that a level of the treatment liquid lying above the path of motion of the printed-circuit boards is established in the container in a dynamic equilibrium between supply and overflow. The printed-circuit boards are not, therefore, simply drawn through a motionless treatment liquid, but are rather brought into an interaction with the treatment liquid which is constantly renewed.

However, this constant renewal means that there is an additional relative movement between printed-circuit board and treatment liquid. In order that this should not have a detrimental effect on the outcome, a further feature of the invention provides that the treatment liquid is introduced via distribution pipes into the lower region of the container and that a shielding plate is arranged between the distribution pipes and the path of motion of the printed-circuit boards, the edges of said sheilding plate extending close to the side walls of the container. Consequently, turbulence that might arise as a result of introducing the treatment liquid into the container is essentially dissipated beneath the shielding plate. The treatment liquid then passes upwards through the gaps between the edges of the shielding plate and the side walls of the container in a controlled flow process. The printed-circuit boards move above the shielding plate in a calm, defined flow configuration.

Pairs of rolls and/or roll/roller pairs can be arranged at the points where the printed-circuit boards enter into and exit from the container, whereby the printed-circuit boards are passed between the partners of the pairs. By "rolls" we understand here components whose axial extension runs essentially over the whole width of the container. "Rollers", in contrast, are relatively short components in the axial direction, of which there are always several beside one another and distributed at axial intervals over the width of the container. A roll-/roller pair therefore comprises a roll extending over the whole width of the container on one side of the path of motion of the printed-circuit board, whereas on the opposite side of the path of motion it has a number of rollers arranged at a distance from one another.

The roll situated on top and the rollers situated on top in the respective pairs serve respectively as retaining rolls and retaining rollers against which the treatment liquid can dam up above the path of motion of the printed-circuit boards.

As already mentioned on several occasions, the achievement of defined flow conditions in the individual treatment modules is of great importance if a reproducible result is to be obtained. In this regard, it is perhaps not so much a matter how the flow conditions appear, but more a matter of the flow conditions being defined. That is to say that the operational conditions can then be adapted to the defined flow conditions, whereas with undefined flows conditions such adaptation cannot be made. In this connection, it has proved to be advantageous for a pair of rolls to be arranged at the point of entry of the printed-circuit boards into the container and for a roll/roller pair to be arranged at the point where the printed-circuit boards exit from the container. In the roll/roller pair, the rollers should be the ones on top. As a result of the gaps existing between the individual rollers, the damming effect here is less than at the opposite end where the upper partner of the pair is a continuous roll. This means that the treatment liquid dammed up between the pair of rolls and the roll/roller pair acquires a main direction of flow in the direction of the roll/roller pair. In this way, therefore, a defined motion of the treatment liquid is forced in this decisive area.

The rolls in the pair of rolls at the point of entry into the container should be made from poorly wettable material, preferably PTFE. This prevents the rolls from entraining treatment liquid during rotation from the internal space of the container and carrying it outside or even spraying it in an uncontrolled manner. As already mentioned on several occasions, this would lead to uncontrolled contacts between the printed-circuit boards and the treatment liquid before the time at which this contact is actually desired.

One or more modules in which one of the processes a to d takes place can be provided with a filter through which the treatment liquid of said module is circulated. After what has been said above, it will probably be evident that the cleanness of the treatment liquid is important for the result sought. This cleanness is guaranteed by the continuous circulation of the treatment liquid through the filter.

In order to intensify the interaction between treatment liquid and printed-circuit board, it may be recommendable for one or more of the modules in which one of the processes a to d takes place to be provided with an ultrasonic transmitter, by means of which the treatment liquid in said module can be exposed to the effects of ultrasound.

For this reason, one embodiment of the invention distinguishes iteslf by the fact that one or more of the modules in which processes a to d take place is provided with a nozzle arranged in the proximity of the path of motion of the printed-circuit boards, said nozzle causing a forced flow through the drill-holes with the aid of pressure and/or underpressure.

Surprisingly, it has emerged that the times spent by the printed-circuit boards in the individual treatment liquids in the continuous process differ considerably from those that are considered necessary with the known dipping method. Overall, it can be said that a considerable reduction can be achieved with the times spent in the plant according to the invention. It has been demonstrated when the times spent by the printed-circuit boards in the individual modules are as follows:
Modul in which process a takes place: approx. 14 s
Modul in which process b takes place: approx. 40 s
Modul in which process c takes place: approx. 40 s
Modul in which process d takes place: approx. 20 s These times spent in the modules are achieved in the known manner by mutually coordinating the speed of the conveyor system and the length of the individual modules.

The ratio of the times spent in the last two modules of the plant according to the invention has proved to be especially important. Irrespective of the absolute magnitude of these times spent in the modules, it is recommended that the module in which process d takes place should be roughly half the length of the module in which process c takes place. This means that the time spent in the last module should always be around half the time spent in the penultimate module.

An example of embodiment of the invention is explained in greater detail below with the aid of the drawing.

Figure 1:
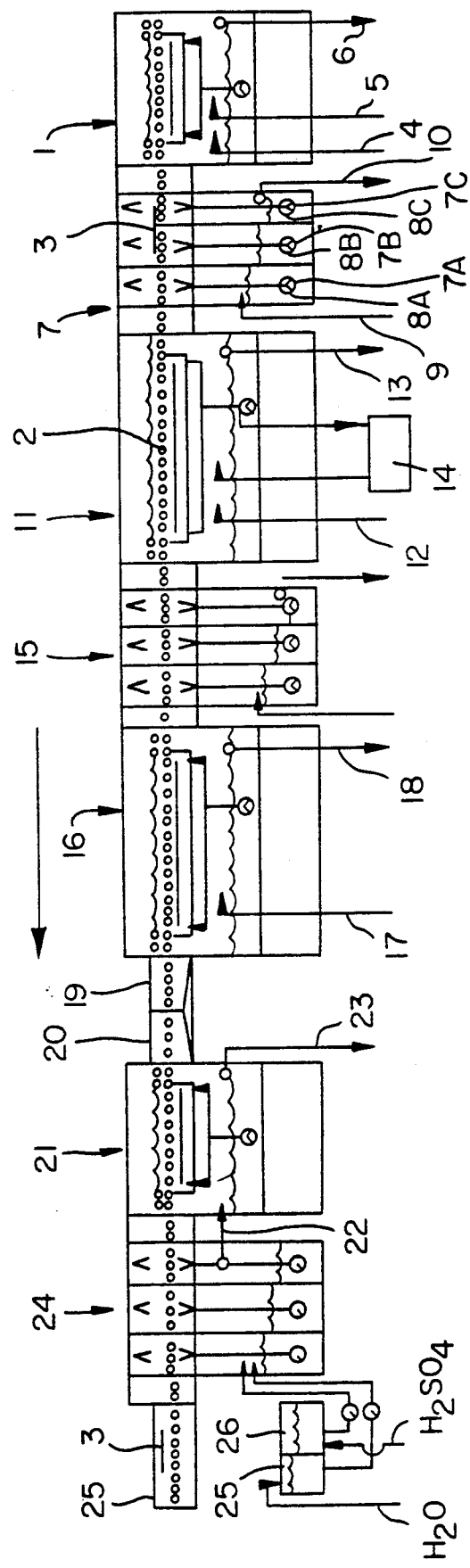
FIG. 1 shows: a diagrammatic side view of a plant for the manufacture of feedthrough printed-circuit boards in the area in which the conductive coating required for metallisation is deposited onto the lateral surface of the drill-holes.

FIG. 1 represents a section from a plant for the manufacture of foodthrough printed-circuit boards. It shows the area concerned with obtaining a conductive coating on the lateral surfaces of the drill-holes provided in the printed-circuit boards. This first coating then serves for the further external-currentless or electrolytic-galvanic build-up of a relatively thick metallic (generally copper) coating. The corresponding parts of the plant are not represented in FIG. 1; they would follow on at the left-hand side. In the continuation of the overall plant, there are then machines which are concerned with the formation of the conductor pattern, so that printed-circuit boards with finished conductor patterns on both sides emerge at the end of the overall plant, the conductor patterns on both sides being connected to one another electrically (="throughfed") via various drill-holes.

Further parts of the plant are also envisaged on the right-hand side of the area of the plant shown in FIG. 1. In these parts the various drill-holes are produced in the printed-circuit boards and the drill-holes are then mechanically deburred (brushed); impurities from the lateral surfaces of the drill-holes are removed. In addition, a first etching ("micro-etching") takes place which serves to remove oxide coatings and to improve adhesion.

The printed-circuit boards thus pre-treated enter at the right-hand side of the area of the plant represented in FIG. 1 and make their way through the latter in the direction of the arrow drawn in above the plant.

The plant is constructed in a modular fashion, i.e. it is composed of individual standardised machines in each of which a step in the process takes place. The modules are adapted to one another in such a way that they can be placed together on the building block principle to form a whole plant. Each module represents in principle a machine capable of functioning in its own right and is generally saleable independently in the trade.

The general mode of operation and the structure of the etching plant will next be explained with the aid of FIG. 1, without going into the individual structural parts; the precise structure of the individual modules, insofar as it is of interest in the present connection, will be discussed below with the aid of FIGS. 2 and 3.

In module 1 on the far right in FIG. 1, the pre-treated, i.e. especially provided with drill-holes, deburred and cleaned printed-circuit boards are subjected to "conditioning". By "conditioning" we understand here treatment with an aqueous-alkaline solution of an organic solvent, which in particular puts the lateral surfaces of the drill-holes into a state in which adhesion of the coating applied in the subsequent module is guaranteed. As regards details of the chemistry and the operation of the process, reference is made to DE-PS 38 06 884 already mentioned above. Thus, insofar as no particular information is given about the continuous process applied here, reference can be made to the teaching of DE-PS 38 06 884.

The printed-circuit boards are conveyed through the various modules on a roller conveyor system 2 which directly links up at the various transition points of the individual modules and can either be driven separately for each individual module or driven from a common source by means of an appropriate linkage between the modules. In those modules, such as module 1 for example, where a chemical/physical process step takes place in a treatment liquid, the printed-circuit board, which is indicated in FIG. 1 by reference number 3, moves beneath the surface of the respective liquid. The design measures used to achieve this will be explained below.

NaOH is fed via line 4 and the above-mentioned organic solvent via line 5 to module 1. Used treatment liquid can be removed from module 1 via a further line 6.

The printed-circuit boards 3 treated in module 1 enter into a rinsing module 7 where they are conveyed forward on the conveyor system 2 whilst being sprayed from above and below with rinsing water. The rinsing module 7 is designed in the manner of a cascade. To achieve this, it is split up into three individual compartments 7a to 7c which each have a separate sump. Each sump is provided with its own pump 8a, 8b, 8c, which pumps the rinsing water up to tuyère connections along the path of motion of the printed-circuit boards 3. Fresh water is fed to the rinsing module 7 via line 9 to the end at which the cleaned printed-circuit boards 3 leave the rinsing module 7. The rinsing water gets out of compartment 7a of rinsing module 7 in the overflow process, in the direction opposite to that in which the printed-circuit boards 3 are moving, into the compartments 7b and 7c and is then conducted away via line 10. The effect of this counterflow process is such that the printed-circuit boards 3 inside the rinsing module 7 come into contact with the cleanest rinsing water last.

The printed-circuit boards 3 are carried by the conveyor system 2 out of the rinsing module 7 into an oxidation module 11. In the latter, the lateral surfaces of the feedthrough drill-holes in particular are treated with an oxidising liquid, a step in the process which is of great importance for the adhesion of the electrically conductive film to be applied in the following modules. An alkaline potassium permanganate solution is used as the treatment liquid. This is fed via line 12 and conducted away via line 13. Moreover, the treatment liquid inside the oxidation module 11 is circulated via an electrolysis cell 14 and is thus constantly regenerated, so that the consumption of chemicals inside the oxidation module 11 is kept down to the smallest possible value.

The printed-circuit boards 3 subjected to the oxidation treatment are again conveyed through a rinsing module 15, the construction of which corresponds to rinsing module 7 and through which rinsing water flows also in a cascade-like manner in the counterflow process. To that extent, reference can be made to the above description of the rinsing module 7.

Proceeding from the rinsing module 15, the printed-circuit boards 3 enter into a module 16 which is called a "catalyst module" in reference to the previously used processes. The designation "catalyst" is not wholly appropriate, however, in the present process. It is, on the contrary, in module 16 that the first step takes place on the path towards a conductive coating on the lateral surfaces of the drill-holes.

For this purpose, a treatment liquid is fed via a line 17 into the catalyst module 16 and can be removed again via line 18. The treatment liquid is an aqueous solution of an organic monomer with a certain quantity of organic solvent, preferably an anti-ebullient alcohol. DE-PS 06 884 gives information on the nature of the monomer. The monomers contained in this treatment liquid are deposited (amongst others) on the lateral surfaces of the drill-holes and thus form a thin coating which, however, is not yet conductive in this state.

Without the insertion of a further rinsing module, the printed-circuit boards 3 pass from the output station 19 of the catalyst module 19 into the input station 20 of a so-called "fixing module" 21. In the fixing module 21, the polymerisation of the monomers in the coating takes place which have been deposited on the printed-circuit boards 3 in module 16. A uniformly conductive polymer film is thus formed which, however, barely adhers to the metallic surfaces of the printed-circuit boards 3 and separates from them as a dark deposit. The lateral surfaces of the drill-holes, on the other hand, remain clad with the electrically conductive polymer film in the desired manner.

The "fixing" in the fixing module 21 takes place in an acid medium, if necessary using a small amount of oxidation agent. The acid medium, generally a roughly 5% sulphuric acid, is fed to the fixing module 21 via line 22 and is removed via line 23.

The printed-circuit boards 3, which leave fixing module 21 in FIG. 1 to the left, enter into a rinsing and picking module 24 which in structure corresponds to rinsing modules 7 and 15. The treatment liquid here, however, is not water but 5% sulphuric acid, which is also fed in a cascade-like manner in the counterflow process through the various chambers of the rinsing and pickling module 24.

The 5% sulphuric acid is produced by mixing water and concentrated sulphuric acid, taken from tanks 25 and 26, in the compartment of the rinsing and pickling module 24 that lies farthest to the left in FIG. 1.

The printed-circuit boards 3, thus far completed and prepared for the metalplating of the through-holes, emerge in the output station 25 from the described area of the plant.

Details of the treatment modules 1, 11, 16 and 21 are explained in greater detail below with the aid of FIGS. 2 and 3. FIG. 2 shows the catalyst module 16 on a magnified scale and with more details, as well as the fixing module 21 connected to the latter.

As already mentioned, an essential feature in the treatment of the printed-circuit boards 3 in the individual modules lies in the fact that they are conveyed beneath the level of the treatment liquid, i.e. fully immersed in it, through the respective module. This is achieved by a structural design which will now be described with the aid of FIG. 2 for the catalyst module 16, though it will be found in the same form in all the modules of the plant.

Module 16 contains a sump 26 for the treatment liquid in the lower region. The treatment liquid is fed to this by means of a pump 27 via the line 17 already mentioned above. A pump 28 takes the treatment liquid from the sump 26 and passes it through a valve 29 and a flowrate meter 30 into a container 31 which is arranged directly beneath the conveyor system 2. The treatment liquid is fed into container 31 through two distributing pipes 32 and 33. These are located beneath a shielding plate 34 which runs parallel to the bottom of container 31 and to the conveyor system 2. The edges of the shielding plate 34 extend close to the walls of container 31, so that the treatment liquid can only penetrate upwards in these edge areas. The effect of this is that the printed-circuit boards 3 on the conveyor system 2 above the shielding plate 34 can move in a treatment liquid which is virtually undisturbed by the supply emerging through the distributing pipes 32, 33, and which in particular does not contain any turbulence.

Figure 2:
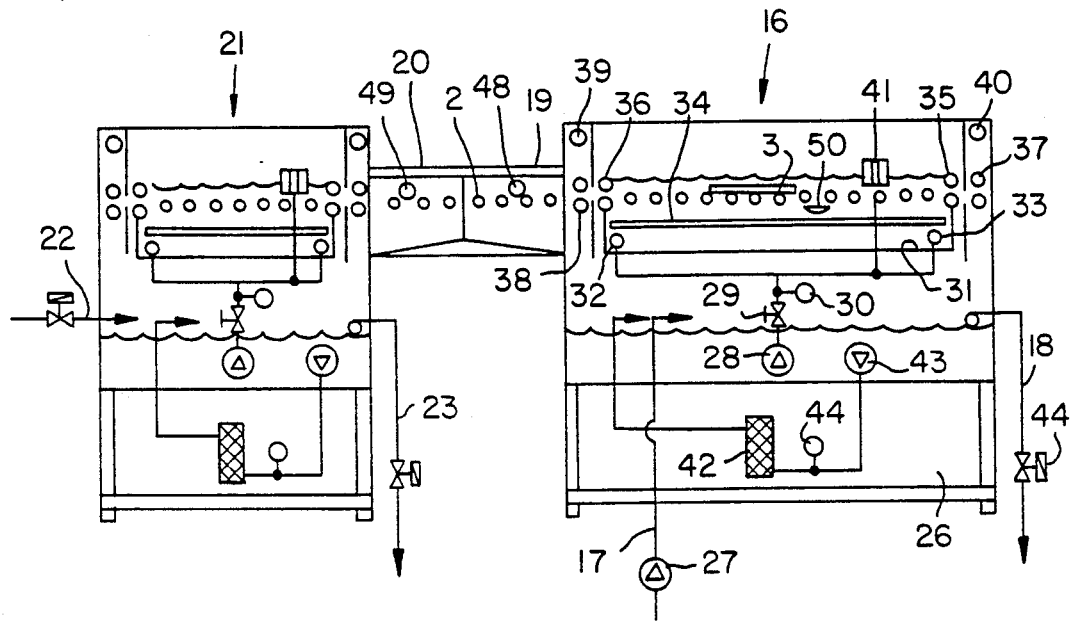
FIG. 2 shows: two of the modules shown in FIG. 1, on a magnified scale.
Figure 3:
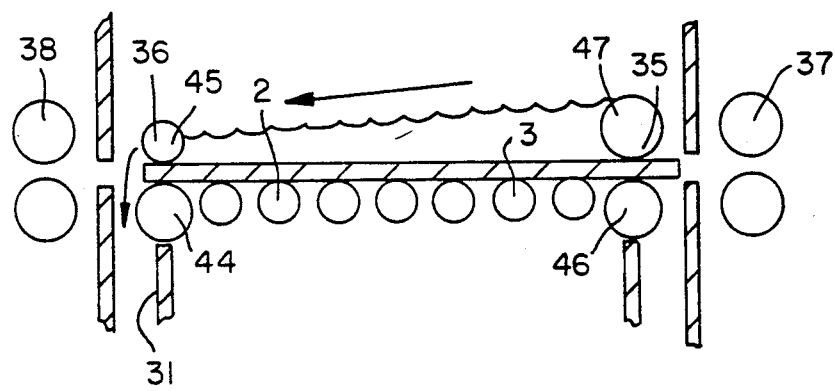
FIG. 3 shows: the area of the conveyor system in one of the modules of FIG. 2, again on a magnified scale.

On the right-hand side of FIG. 2 the printed-circuit boards 3 enter into the treatment liquid damned up in container 31 through a pair of rolls 35. They leave the container 31 again through a roll/roller pair 36 whose function is explained in greater detail below with the aid of FIG. 3. The pair of rolls 35 and the roll/roller pair 36 represent a defined "leak" for container 31, through which treatment liquid can escape from container 31 in proportion as it is newly supplied by pump 28 and through the distributing pipes 32 and 33. In this way, a stationary level of the treatment liquid is maintained which lies above the conveyor system 2 and the printed-circuit boards 3 conveyed on it.

The treatment liquid emerging through the gap of roll pair 35 and the roll/roller pair 36 goes back into the sump 26 of module 16 and is here taken up again by pump 28.

At the entry into and the exit from module 16, the printed-circuit boards 3 run through press-roll pairs 37 and 38 respectively which largely keep the printed-circuit boards 3 free from treatment liquid still adhering to them and so reduce the entrainment of treatment liquid into the following module.

The gases and vapours that are generated inside module 16 are sucked out via lines 39, 40, the outlet points of which can be seen in FIG. 2.

In the treatment liquid dammed up in container 31 there is an ultrasonic transmitter 41 beneath the path of motion of the printed-circuit boards 3, by means of which the effectiveness of the treatment liquid can be increased. Furthermore, a nozzle 50 causing a forced flow through the drill-holes is arranged here which forces treatment liquid through the drill-holes by pressure and/or underpressure.

Housed in the sump 26 of module 16 is a filter 42 through which the treatment liquid in the sump 26 is continuously circulated by means of a pump 43. A manometer 44 indicates when the filter 42 is added.

Finally, line 18 already mentioned above is represented in FIG. 2, through which the treatment liquid can be taken from the module 16. As in all the lines which convey treatment liquid to or from the modules, a solenoid valve 44 is provided in line 18. This solenoid valve 44 is controlled in the known manner and is not the subject-matter of the present invention.

Reference has already been made above to the fact that the entry opening for the printed-circuit boards 3 into the container 31 of module 16 is formed by a pair of rolls 35, whilst the exit opening is formed by a roll/roller pair 36. The reason for this measure will now be explained in greater detail with the aid of FIG. 3.

In order to distinguish "rolls" from "rollers" in the drawing, the former are represented with a somewhat larger diameter; in principle, however, rolls and rollers can have the same diameter. "Roll" is used here to mean an object whose axial dimension extends over the whole width of container 31, whereas a "roller" has a relatively small axial dimension. Where rollers, i.e. circles with a small diameter, are represented in FIG. 3, this should be understood to mean that a number of rollers are arranged on an axle spaced at a distance one behind the other. The roll/roller pair 36 thus comprises a lower roll 44 extending over the whole dimension of container 31 at rightangles to the plane of the drawing, and a number of coaxial rollers 45 lying opposite it. The roll pair 35, in contrast, comprises a lower roll 46 and an upper roll 47 similarly running over the whole width of container 31.

Since, as is self-evident, the liquid dammed up between the pair of rolls 35 and the roll/roller pair 36 can relatively easily flow away through the gaps existing between the rollers 45, a liquid level is established dynamically in container 31, said level descending towards the roll/roller pair 36, so that the space filled with the treatment liquid above the printed-circuit boards 3 is thus in the shape of a wedge. There is prescribed, therefore, within this wedge-shaped space, a main flow direction of the treatment liquid in the direction of motion of the printed-circuit boards 3, i.e. from the pair of rolls 35 to the roll/roller pair 36 in the direction of the arrow shown. This main flow direction guarantees that the treatment liquid, which is of course dammed up dynamically inside container 31, moves in a defined manner over the printed-circuit boards 3. Turbulence and uncontrolled conditions of motion are thus largely eliminated. Defined conditions of movement are essential to the achievement of reproducible results. A main direction of motion of the treatment liquid in the direction of the arrow shown in FIG. 3 has proved to be particularly favourable; in principle, however, it would also be possible to produce a different main direction of motion by means of appropriate corresponding measures.

The rolls 46 and 47 in the pair of rolls 35 on the entry side into container 31 should be made from PTFE ("Teflon") or another material barely wettable by the treatment liquid. This serves to guarantee that no treatment liquid is carried from container 31 to the exterior by the rotation of rolls 46 and 47, which outside the container 31 could get onto the printed-circuit boards 3 and so cause uncontrolled reactions. To achieve optimum results, it has proved to be essential to ensure that the start of the chemical/physical treatment of the printed-circuit boards 3 in the individual modules takes place at a precisely defined time and with a precisely defined strength, simultaneously over the whole width of the printed-circuit board 3.

In the treatment modules 1 and 11, however, such high demands on the treatment quality are not absolutely essential; it is possible here to provide a pair of rolls both on the input side as well as on the output side of the given container 31, so that consequently there is no need to provide a main direction of flow of the treatment liquid inside the container 31 in these modules.

In the output station 19 of the "catalyst module" 16, there is an opening 48 through which supply air can be fed to the interior of the output station 19. In a corresponding manner, there is an opening 49 leading into the input station 20 of fixing module 21, through which the interior of input station 20 can be fed with supply air. In the interplay between the latter and the underpressure in the respective modules 16 and 21, it is ensured that no spray droplets from the treatment liquid of one module can get directly into the other treatment module and vice versa. On the contrary, an airsteam constantly flowing back from the output station 19 into the catalyst module 16 and an airsteam constantly flowing back from the input station 20 into the fixing module 21 ensures that vapours and spray droplets emerging from these modules are returned back into them. This also assists in ensuring that the printed-circuit boards 3 can never come into contact in an uncontrolled manner with a treatment liquid, which would lead to defective results.

The times spent by the printed-circuit boards 3 in the different treatment modules should be roughly as follows:

Conditioning module: approx. 14 s
Oxidation module: approx. 40 s
Catalyst module: approx. 40 s
Fixing module: approx. 20 s These times spent in the different modules do not agree with those that have been determined according to the state of the art for the dipping method. All the times are considerably shorter, so that significantly higher manufacturing capacities can thus be achieved. Furthermore, the time spent in the fixing module 21, in contrast with the situation in the dipping method, is only about half the time spent in the catalyst module 16; this is reflected structurally in the fact that fixing module 21 is only about half the length of the catalyst module 16.

We claim:

1. A plant for the manufacture of feedthrough printed-circuit boards or multi-layers containing drill-holes to produce an electrically conductive polymeric coating on the lateral surfaces of the drill-holes which includes
   (a) a module (1) containing an alkaline aqueous solution of an organic solvent for conditioning said drill hole lateral surfaces,
   (b) a module (11) containing an oxidizing treatment liquid for pretreating said drill hole lateral surfaces,
   (c) a module (16) containing an aqueous solution of organic monomers for depositing a coating of organic monomers on said drill hole lateral surfaces,
   (d) a module (21) containing an acidic treatment solution for polymerizing the monomers deposited on said drill hole lateral surfaces to form an electrically conductive coating on said drill hole lateral surfaces,
   (e) a liquid container (31) in said module (16) and a liquid container (31) in said module (21), each liquid container (31) having a bottom wall, side walls disposed parallel to the direction in which the circuit boards are to move as well as front and rear end walls disposed perpendicular to the direction in which the circuit boards are to move,
   (f) means for conveying the circuit boards (3) in sequence through each of said modules (1, 11, 16 and 21), said means including a horizontally disposed conveyor (2) whose upper conveying surface is at least level with the upper edges of the end walls of said containers (31),
   (g) means for maintaining in each container (31) a non-turbulent body of treatment liquid whose upper surface is above the upper edges of said front and rear end walls and also above the upper surface of circuit boards in each module, said means including
      (i) a pair of vertically aligned rolls (44, 45) mounted directly above the upper edges of the front end wall of each container (31) between which circuit boards are adapted to pass, and
      (ii) a pair of vertically aligned rolls (46, 47) mounted directly above the rear end wall of each container (31) between which circuit boards are adapted to pass,
      (iii the lower roll (44, 46) of each said pair of rolls approximating pressing contact with an upper edge of either said front or rear end wall, and the upper roll of each said pair of vertically aligned rolls (45, 47) being pressed downwardly into contact with said lower rolls (44, 46), except when a circuit board is passing between them,
      (iv) at least one inlet for introducing treatment liquid into each container (31) only at a point that is lower than the upper surface of said conveyor means (2)
         whereby the level of treatment liquid in each said container will be maintained above the upper edges of said front and rear end walls across the entire container (31) even when no treatment liquid is being introduced into each container (31).

2. A plant according to claim 1 wherein a rinsing module (7) with an inlet rinsing spray is provided between modules (1) and (11) and a rinsing module (15) with an inlet rinsing spray is provided between modules (11) and (16), but no rinsing between modules (16) and (21).

3. A plant according to claim 2 wherein said rinsing modules (7, 15) are designed as a cascade rinsing machine with several separate chambers (7a, 7b, 7c) with said inlets for directing rinsing water in an opposite direction to that of the motion of the printed-circuit boards (3).

4. A plant according to claim 2 wherein module (21) is followed by a rinsing and pickling module (24) with an inlet sprayer for spraying dilute acid on both sides of the printed circuit boards.

5. A plant according to claim 4 which contains an outlet for the rinsing and pickling liquid is connected to an inlet to module (21).

6. A plant according to claim 1 which additionally contains an electrolysis cell (14) for regenerating the treatment liquid in module (11).

7. A plant according to claim 1 wherein each container (31) is provided with a shielding plate (34) whose outer edges extend close to the walls of the container (31) at a point below said conveyor (2) and said at least one inlet set forth in section (iv) is located at a point below said shielding plate.

* * * * *